(12) United States Patent
Choi et al.

(10) Patent No.: US 8,339,879 B2
(45) Date of Patent: Dec. 25, 2012

(54) REPAIR CIRCUIT AND SEMICONDUCTOR APPARATUS INCLUDING THE SAME

(75) Inventors: Min Seok Choi, Ichon-shi (KR); Young Jun Ku, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 210 days.

(21) Appl. No.: 12/836,443

(22) Filed: Jul. 14, 2010

(65) Prior Publication Data

US 2011/0128072 A1    Jun. 2, 2011

(30) Foreign Application Priority Data

Nov. 30, 2009   (KR) .................. 10-2009-0116386

(51) Int. Cl.
   *G11C 7/00* (2006.01)
(52) U.S. Cl. ............... 365/198; 327/565; 365/189.05
(58) Field of Classification Search .......... 365/200, 365/189.05, 201, 191, 49, 222, 198; 257/565; 327/565
   See application file for complete search history.

(56) References Cited

U.S. PATENT DOCUMENTS

| | | | |
|---|---|---|---|
| 7,317,256 | B2 | 1/2008 | Williams et al. |
| 7,598,523 | B2 | 10/2009 | Luo et al. |
| 2008/0315388 | A1 | 12/2008 | Periaman et al. |
| 2009/0020865 | A1 | 1/2009 | Su |
| 2009/0134500 | A1 | 5/2009 | Kuo |
| 2009/0166873 | A1 | 7/2009 | Yang et al. |
| 2010/0060310 | A1 * | 3/2010 | Laisne et al. ............. 326/10 |
| 2011/0006391 | A1 * | 1/2011 | Lee et al. ............. 257/529 |
| 2011/0102011 | A1 * | 5/2011 | Van der Plas et al. ... 324/762.03 |

FOREIGN PATENT DOCUMENTS

| | | |
|---|---|---|
| KR | 1020040093787 | 11/2004 |
| KR | 1020080068206 | 1/2007 |
| KR | 1020070039978 | 4/2007 |
| KR | 1020080104578 | 12/2008 |

OTHER PUBLICATIONS

Uksong Kang et al., "8Gb 3D DDR3 DRAM Using Through-Silicon Via Technology", 2009 IEEE International Solid-State Circuits Conference, ISSCC 2009/Session 7/DRAM/7.2, Digest of Technical Papers, Feb. 10, 2009, pp. 130-132.

* cited by examiner

*Primary Examiner* — Dang Nguyen
(74) *Attorney, Agent, or Firm* — William Park & Associates Ltd.

(57) ABSTRACT

A repair circuit of a semiconductor apparatus includes a transmission control unit configured to generate first through $n^{th}$ (n is an integer equal to or greater than 2) control signals in response to a repair information signal, and enable all $m^{th}$ through $n^{th}$ control signals when the repair information signal indicating an $m^{th}$ (m is an integer equal to or greater than 1 and equal to or less than n) TSV is inputted; transmission units configured to allocate transmission paths for first through $n^{th}$ signals to first through $n^{th}$ TSVs and a repair TSV in response to the first through $n^{th}$ control signals; and receiving units configured to receive the signals transmitted from the first through $n^{th}$ TSVs and the repair TSV in response to the first through $n^{th}$ control signals.

7 Claims, 4 Drawing Sheets

| sel<0> | sel<1> | OUT |
|---|---|---|
| L | L | SIG<1> |
| L | H | block |
| H | L | not define |
| H | H | SIG<0> |

| sel<0> | OUT |
|---|---|
| L | TSV0 |
| H | TSV1 |

US 8,339,879 B2

REPAIR CIRCUIT AND SEMICONDUCTOR APPARATUS INCLUDING THE SAME

CROSS-REFERENCE TO RELATED APPLICATION

The present application claims priority under 35 U.S.C. §119(a) to Korean Application No. 10-2009-0116386, filed on Nov. 30, 2009, in the Korean Intellectual Property Office, which is incorporated herein by reference in its entirety as if set forth in full.

BACKGROUND

1. Technical Field

Various embodiments of the present disclosure generally relate to a semiconductor apparatus, and more particularly, to a three-dimensional semiconductor apparatus which uses through-silicon vias.

2. Related Art

In order to increase the degree of integration of a semiconductor apparatus, a three-dimensional (3D) semiconductor apparatus comprising a plurality of stacked chips has been developed. The stacked chips provide a structure that enables the 3D semiconductor apparatus to be packaged in a single package. Recently, a through-silicon via (TSV) type semiconductor apparatus has been developed in which silicon vias are formed through a plurality of stacked chips so that all of the chips are electrically connected to one another.

The three-dimensional semiconductor apparatus has a plurality of TSVs so that the plurality of stacked chips can commonly receive various signals. Various defects, however, may occur in the TSVs. For example, the defects may include voids created due to incomplete filling of a conductive material in the TSVs, bump contact fails caused by the warpage of the chips or the migration of a bump material, cracks in the TSVs themselves, etc.

Since the TSVs electrically connect the plurality of chips, if a defect occurs and a TSV creates an open circuit, the TSV cannot function properly. Therefore, a defective TSV must be replaced with a functional TSV.

FIG. 1 is a diagram illustrating a repair operation of a conventional repair circuit of a semiconductor apparatus. FIG. 1 shows first through fourth TSVs TSV0 through TSV3 for transmitting first through fourth signals SIG<0:3> and two repair TSVs RTSV0 and RTSV1. Signal lines for the first signal SIG<0> are disposed such that the first signal SIG<0> can be transmitted not only through the first TSV TSV0 but also through the first repair TSV RTSV0 and the second TSV TSV1, and signal lines for the second signal SIG<1> are disposed such that the second signal SIG<1> can be transmitted not only through the second TSV TSV1 but also through the first and third TSVs TSV0 and TSV2. Signal lines for the third signal SIG<2> and the fourth signal SIG<3> are disposed in the same manner.

The repair circuit is configured such that, when a defect occurs in one of the first and second TSVs TSV0 and TSV1, signal transmission can be detoured through the first repair TSV RTSV0, and when a defect occurs in one of the third and fourth TSVs TSV2 and TSV3, signal transmission can be detoured through the second repair RTSV1. Accordingly, if a defect occurs in the second TSV TSV1 and transmission of the second signal SIG<1> through the second TSV TSV1 becomes impossible, the repair circuit allows the first signal SIG<0> to be transmitted through the first repair TSV RTSV0 and the second signal SIG<1> to be transmitted through the first TSV TSV0. In this way, a signal is transmitted by being detoured around a TSV in which a defect occurs. While not shown in FIG. 1, the repair circuit has multiplexers provided at terminals which transmit and receive the first through fourth signals SIG<0:3>, so that signal transmission paths can be changed. In the conventional repair circuit, since at least two signal lines should be disposed for each TSV, the area occupied by the signal lines is substantial, and the area of the multiplexers for transmitting and receiving the signals markedly increases.

In the conventional art, one set of TSVs is formed by allocating two repair TSVs for a predetermined number of TSVs (four TSVs in FIG. 1). However, since about 200-300 TSVs are disposed in one three-dimensional semiconductor apparatus, the number of sets dramatically increases. Also, because the number of control signals inputted to the multiplexers to detour the signal transmission paths cannot help but be limited, the control signals inputted to the multiplexers of a plurality of sets cannot help but be commonly used.

While the process for repairing a defective TSV is important, it is difficult to say that the probability of a defect to occur in a TSV is so substantial. In this regard, in the conventional art, since the respective sets commonly use the control signals, signal transmission cannot help but be detoured despite normal TSVs, which results in an inefficient repair process. Further, because the control signals for controlling the multiplexers should be individually generated, a decoding procedure for generating the control signals are involved, and the configuration of a decoding circuit is complicated.

SUMMARY OF THE INVENTION

Various aspects of the present invention comprise a repair circuit of a semiconductor apparatus capable of efficient repair.

According to one aspect of the present invention, a repair circuit of a semiconductor apparatus comprises a transmission control unit configured to generate first through $n^{th}$ (n is an integer equal to or greater than 2) control signals in response to a repair information signal, and enable all $m^{th}$ through $n^{th}$ control signals when the repair information signal indicating an $m^{th}$ (m is an integer equal to or greater than 1 and equal to or less than n) TSV is inputted; transmission units configured to allocate transmission paths for first through $n^{th}$ signals to first through $n^{th}$ TSVs and a repair TSV in response to the first through $n^{th}$ control signals; and receiving units configured to receive the signals transmitted from the first through $n^{th}$ TSVs and the repair TSV in response to the first through $n^{th}$ control signals.

According to another aspect of the present invention, a repair circuit of a semiconductor apparatus comprises a first transmission unit configured to output a first signal to a first TSV in response to a ground voltage and a first control signal; a second transmission unit configured to output one of the first signal and a second signal to a second TSV in response to the first control signal and a second control signal; a third transmission unit configured to output the second signal to a repair TSV in response to the second control signal and an external supply voltage; a first receiving unit configured to output one of signals outputted from the first and second TSVs in response to the first control signal; and a second receiving unit configured to output one of signals outputted from the second and repair TSVs in response to the second control signal.

According to still another aspect of the present invention, a repair circuit of a semiconductor apparatus includes first through $n^{th}$ TSVs and a repair TSV for transmitting first through $n^{th}$ (n is an integer equal to or greater than 2) signals, wherein, when a defect occurs in an $m^{th}$ (m is an integer equal to or greater than 1 and equal to or less than n) TSV, a transmission path for an $m^{th}$ signal is allocated to an $m+1^{st}$ TSV and transmission paths for $m+1^{st}$ through $n^{th}$ signals are allocated to $m+2^{nd}$ TSVs and the repair TSV.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
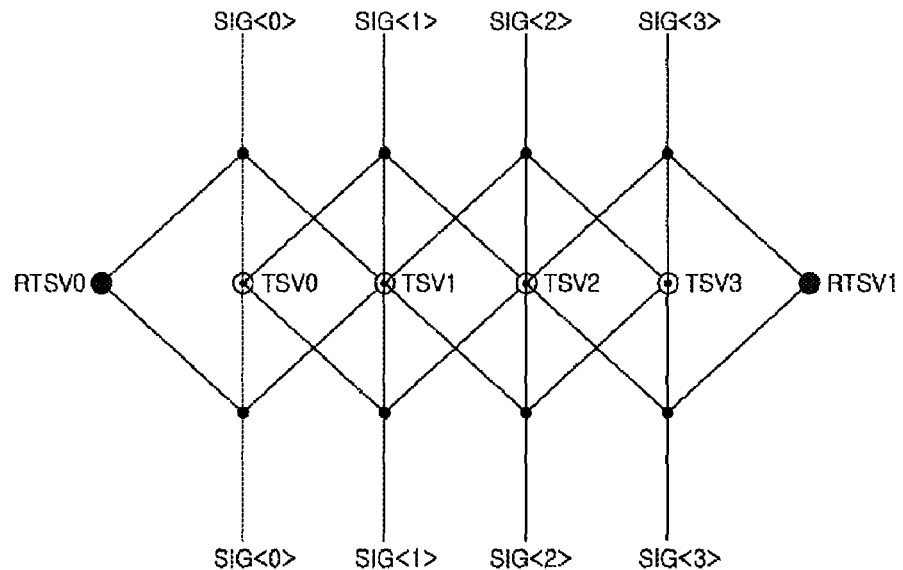
FIG. 1 is a diagram illustrating a repair operation of a conventional repair circuit of a semiconductor apparatus.

Advantages and characteristics of the present invention and a method for achieving them will be apparent with reference to embodiments described below with reference to the accompanying drawings. However, the present invention is not limited to the exemplary embodiments described below but may be implemented in various forms. Therefore, the exemplary embodiments are provided to enable those skilled in the art to thoroughly understand the teaching of the present invention and to completely inform the scope of the present invention and the exemplary embodiment is just defined by the scope of the appended claims. Throughout the specification, like elements refer to like reference numerals.

Figure 2:
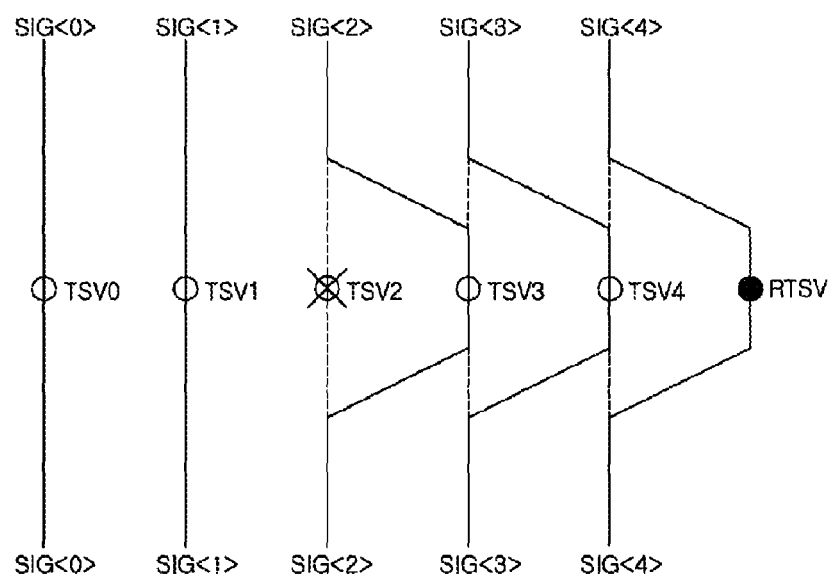
FIG. 2 is a diagram illustrating a repair operation of a repair circuit of a semiconductor apparatus in accordance with one embodiment of the present invention.

FIG. 2 is a diagram illustrating a repair operation of a repair circuit of a semiconductor apparatus in accordance with one embodiment of the present invention. Referring to FIG. 2, the repair circuit includes first through fifth TSVs TSV0 through TSV4 and a repair TSV RTSV. Although only six TSVs are shown in FIG. 2, it is to be understood that any number of TSVs may be used. The first through fifth TSVs TSV0 through TSV4 may be configured to transmit first through fifth signals SIG<0:4>.

For example, if a defect occurs in the third TSV TSV2 and the third TSV TSV2 cannot be used for signal transmission, a repair process is required to ensure that the third signal SIG<2> originally intended to be transmitted through the third TSV TSV2 can be transmitted through a functioning TSV. The repair circuit of a semiconductor apparatus in accordance with one embodiment of the present invention allocates a signal transmission path such that the signal transmission path extends to a repair TSV rather than the TSV in which the defect occurs, and performs a repair operation. As shown in FIG. 2, the third signal SIG<2> is transmitted through the fourth TSV TSV3, the fourth signal SIG<3> is transmitted through the fifth TSV TSV4, and the fifth signal SIG<4> is transmitted through the repair TSV RTSV. Thus, transmission paths for the third through fifth signals SIG<2:4> are respectively reallocated to the fourth TSV TSV3, the fifth TSV TSV4 and the repair TSV RTSV.

The repair circuit of a semiconductor apparatus in accordance with one embodiment of the present invention does not need separate signal lines to reallocate the transmission paths for the signals. Therefore, as the number of signal lines decreases, area utilization efficiency in chips is improved.

Figure 3:
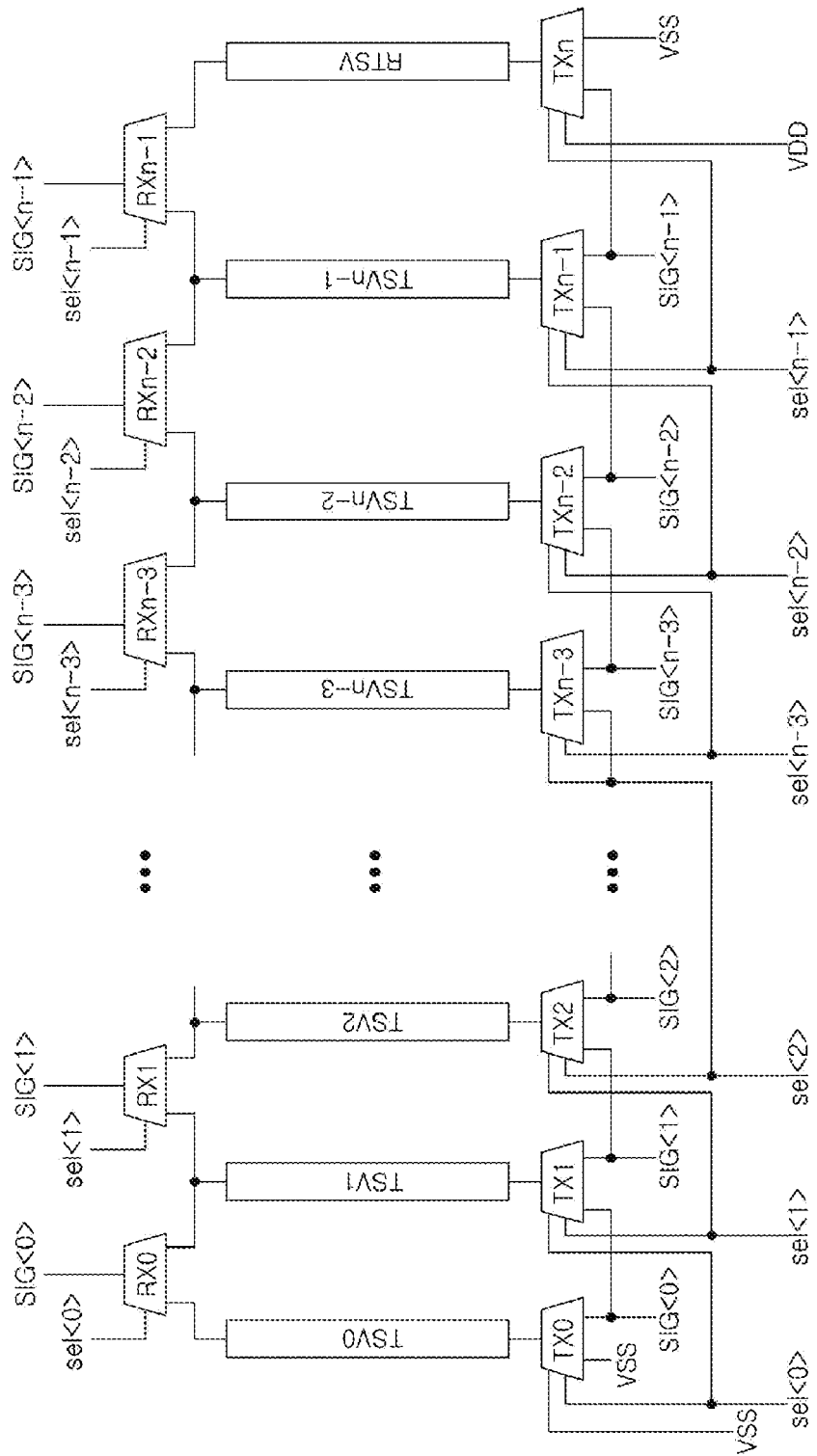
FIG. 3 is a diagram schematically illustrating the configuration of the repair circuit of a semiconductor apparatus in accordance with one embodiment of the present invention.

FIG. 3 is a diagram schematically illustrating the configuration of a repair circuit of a semiconductor apparatus in accordance with one embodiment of the present invention. Referring to FIG. 3, the repair circuit includes first through $n+1^{st}$ transmission units TX0 through TXn, first through $n^{th}$ TSVs TSV0 through TSVn-1, a repair TSV RTSV, first through $n^{th}$ receiving units RX0 through RXn-1. The first through $n+1^{st}$ transmission units TX0 through TXn and the first through $n^{th}$ receiving units RX0 through RXn-1 can be disposed in different chips. If the first through $n^{th}$ TSVs TSV0 through TSVn-1 and the repair TSV RTSV electrically connect first and second chips by passing through them, the first through $n+1^{st}$ transmission units TX0 through TXn may be disposed in the first chip, and the first through $n^{th}$ receiving units RX0 through RXn-1 may be disposed in the second chip.

Each of the first through $n+1^{st}$ transmission units TX0 through TXn receives a signal which is allocated to it and a signal which is allocated to an adjacent transmission unit. The output terminals of the first through $n+1^{st}$ transmission units TX0 through TXn are respectively connected with the first through $n^{th}$ TSVs TSV0 through TSVn-1 and the repair TSV RTSV. Each of the first through $n+1^{st}$ transmission units TX0 through TXn outputs one of the signal which is allocated to it and the signal which is allocated to the adjacent transmission unit, in response to each of first through $n^{th}$ control signals sel<0:n-1>. Hence, each of the first through $n^{th}$ TSVs TSV0 through TSVn-1 and the repair TSV RTSV transmits one of a signal which is intended to be transmitted by it and a signal which is intended to be transmitted by an adjacent TSV.

The control signals sel<0:n-1> have a number n that is the same as the number of the first through $n^{th}$ TSVs TSV0 through TSVn-1. The control signals sel<0:n-1> serve as signals for controlling the first through $n+1^{st}$ transmission units TX0 through TXn so as to allocate TSVs through which first through $n^{th}$ signals SIG<0:n-1> are to be transmitted. Also, the control signals sel<0:n-1> serve as signals for controlling the first through $n^{th}$ receiving units RX0 through RXn-1 so as to output the first through $n^{th}$ signals SIG<0:n-1> transmitted through the first through $n^{th}$ TSVs TSV0 through TSVn-1 and the repair TSV RTSV. The control signals sel<0:n-1> can include a ground voltage VSS and an external supply voltage VDD for determining signals which are to be transmitted through the first TSV TSV0 and the repair TSV RTSV.

In FIG. 3, the first transmission unit TX0 receives the ground voltage VSS and the first signal SIG<0>, and outputs one of the ground voltage VSS and the first signal SIG<0> in response to the first control signal sel<0> and the ground voltage VSS. The second transmission unit TX1 receives the second signal SIG<1> and the first signal SIG<0> allocated to the adjacent transmission unit TX0, and outputs one of the first and second signals SIG<0> and SIG<1> in response to the first control signal sel<0> and the second control signal sel<1>. The third transmission unit TX2 receives the third signal SIG<2> and the second signal SIG<1>, and outputs one of the second and third signals SIG<1> and SIG<2> in response to the second control signal sel<1> and the third control signal sel<2>. Similarly, each of the $n-2^{nd}$ transmission unit through the $n^{th}$ transmission unit TXn-3 through TXn-1 receives a signal which is allocated to a previous transmission unit and a signal which is allocated to it, and outputs one of the inputted signals in response to each of the corresponding control signals sel<n-3:n-1>. The n+1 transmission unit receives the $n^{th}$ signal SIG<n-1> and the ground voltage VSS, and outputs one of the $n^{th}$ signal SIG<n-1> and the ground voltage VSS in response to the $n^{th}$ control signal sel<n-1> and the external supply voltage VDD.

Each of the first through $n^{th}$ receiving units RX0 through RXn-1 receives a signal which is transmitted from a TSV allocated to it and a signal which is transmitted from an adjacent TSV. Each of the first through $n^{th}$ receiving units RX0 through RXn-1 outputs one of the signal which is transmitted from the TSV allocated to it and the signal which is transmitted from the adjacent TSV, in response to each of the corresponding control signals sel<0:n-1>.

The first receiving unit RX0 receives signals which are transmitted from the first and second TSVs TSV0 and TSV1, and outputs one of the two signals in response to the first control signal sel<0>. The second receiving unit RX1 receives signals which are transmitted from the second and third TSVs TSV1 and TSV2, and outputs one of the two signals in response to the second control signal <1>. Similarly, each of the third through $n^{th}$ receiving units RX2 through RXn-1 receives two signals, and outputs one of the two signals in response to each of the corresponding control signals sel<2:n-1>.

Figure 4A:
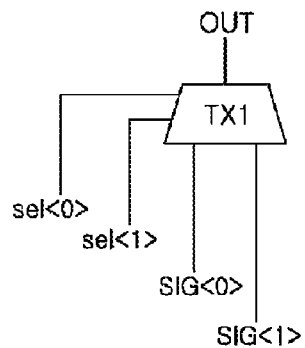
FIG. 4A illustrates diagrams explaining operation of a transmission unit and FIG. 4B illustrates diagrams explaining operation of a receiving unit shown in FIG. 3.
Figure 4B:
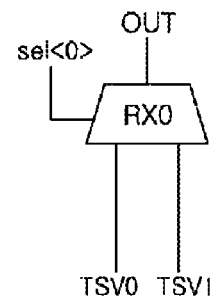

FIGS. 4A and 4B show diagrams explaining operations of a transmission unit and a receiving unit shown in FIG. 3. Since the first through n+1$^{st}$ transmission units TX0 through TXn have essentially the same configuration and the first through $n^{th}$ receiving units RX0 through RXn-1 have essentially the same configuration, for brevity, only the second transmission unit TX1 and the first receiving unit RX0 are described below.

In FIG. 4A, the second transmission unit TX1 receives the first and second signals SIG<0> and SIG<1>, and outputs one of the two signals SIG<0> and SIG<1> in response to the first and second control signals sel<0> and sel<1>. As shown in one table of FIG. 4A, the second transmission unit TX1 is configured to output the second signal SIG<1> when the first and second control signals sel<0> and sel<1> have a low level and output the first signal SIG<0> when the first and second control signals sel<0> and sel<1> have a high level. The second transmission unit TX1 blocks the output of both signals SIG<0> and SIG<1> when the first control signal sel<0> has a low level and the second control signal sel<1> has a high level. The case in which the first control signal sel<0> has a high level and the second control signal sel<1> has a low level is not defined. Therefore, if at least one of the control signals sel<0:n-1>, which is associated with a TSV having a defect, is inputted as a high level, the repair operation can be performed. That is to say, in the event that a defect occurs in the third TSV TSV2, the control signals sel<0:n-1> are inputted such that the first and second control signals sel<0> and sel<1> have a low level and the third through $n^{th}$ control signals sel<2:n-1> have a high level, and signals, which are originally intended to be transmitted through the third through $n^{th}$ TSVs TSV2 through TSVn-1, are respectively detoured to adjacent TSVs and can be transmitted through the fourth through $n^{th}$ TSVs TSV3 through TSVn-1 and the repair TSV RTSV.

As shown in the other table of FIG. 4B, the first receiving unit RX0 outputs a signal which is transmitted from the first TSV TSV0 when the first control signal sel<0> has a low level, and outputs a signal which is transmitted form the second TSV TSV1 when the first control signal sel<0> has a high level. In the event that the defect occurs in the third TSV TSV2 as described above, the first and second control signals sel<0> and sel<1> have a low level, and the third through $n^{th}$ control signals sel<2:n-1> have a high level. Accordingly, in FIG. 3, the first and second receiving units RX0 and RX1 respectively output signals which are transmitted from the first and second TSVs TSV0 and TSV1, and the third through $n^{th}$ receiving units RX2 through RXn-1 respectively output signals which are transmitted from the fourth through $n^{th}$ TSVs TSV3 through TSVn-1 and the repair TSV RTSV. Therefore, it can be appreciated that signal transmission paths can be detoured to a TSV, which is next to a TSV having the defect, and the repair TSV RTSV.

The control signals sel<0:n-1> have information regarding the TSV having the defect. The control signals sel<0:n-1> are signals which can be generated from repair information signals TM<0:m>. The repair circuit of a semiconductor apparatus in accordance with one embodiment of the present invention further includes first and second transmission control units 100 and 200 which are configured to receive the repair information signals TM<0:m> and generate the control signals sel<0:n-1>.

Figure 5:
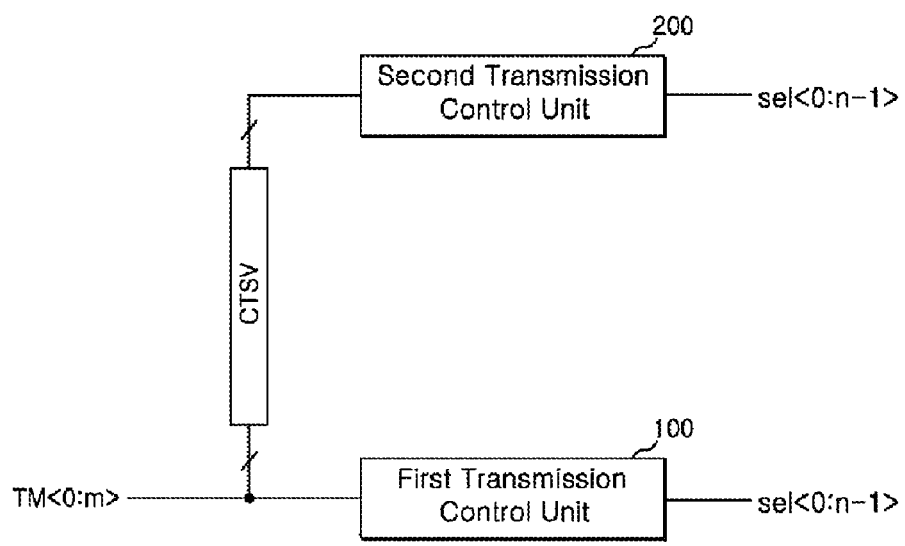
FIG. 5 is a diagram schematically illustrating a connection relationship of first and second transmission control units for the repair circuit of a semiconductor apparatus shown in FIG. 3.

FIG. 5 is a diagram schematically illustrating a connection relationship of the first and second transmission control units 100 and 200. Each of the first and second transmission control units 100 and 200 receives the repair information signals TM<0:m> and generates the control signals sel<0:n-1>. The repair information signals TM<0:m> may comprise, but are not limited to, test mode signals. In other words, signals which are generated by detecting whether respective TSVs are operational may be used. This may be any signal having information that indicates whether a TSV is to be repaired.

The repair information signals TM<0:m> are inputted to the first and second transmission control units 100 and 200 through another TSV CTSV. The first and second transmission control units 100 and 200 may be respectively disposed in different chips. The first and second transmission control units 100 and 200 generate the control signals sel<0:n-1> in response to the repair information signals TM<0:m>. The first and second transmission control units 100 and 200 may have the same configuration. For example, in the event that the defect occurs in the third TSV TSV2, the repair information signals TM<0:m> have information indicating that the defect occurs in the third TSV TSV2. At this time, the first and second transmission control units 100 and 200 enable the third control signal sel<2> in response to the repair information signals TM<0:m>. If the third control signal sel<2> is enabled, the first and second transmission control units 100 and 200 enable the fourth through $n^{th}$ control signals sel<3:n-1>. Accordingly, if the repair information signals TM<0:m> indicating the TSV in which the defect occurs are inputted, the control signals sel<0:n-1> may be generated such that the transmission paths for the signals originally intended to be transmitted through the TSVs after the TSV, in which the defect occurs, are changed.

Figure 6:
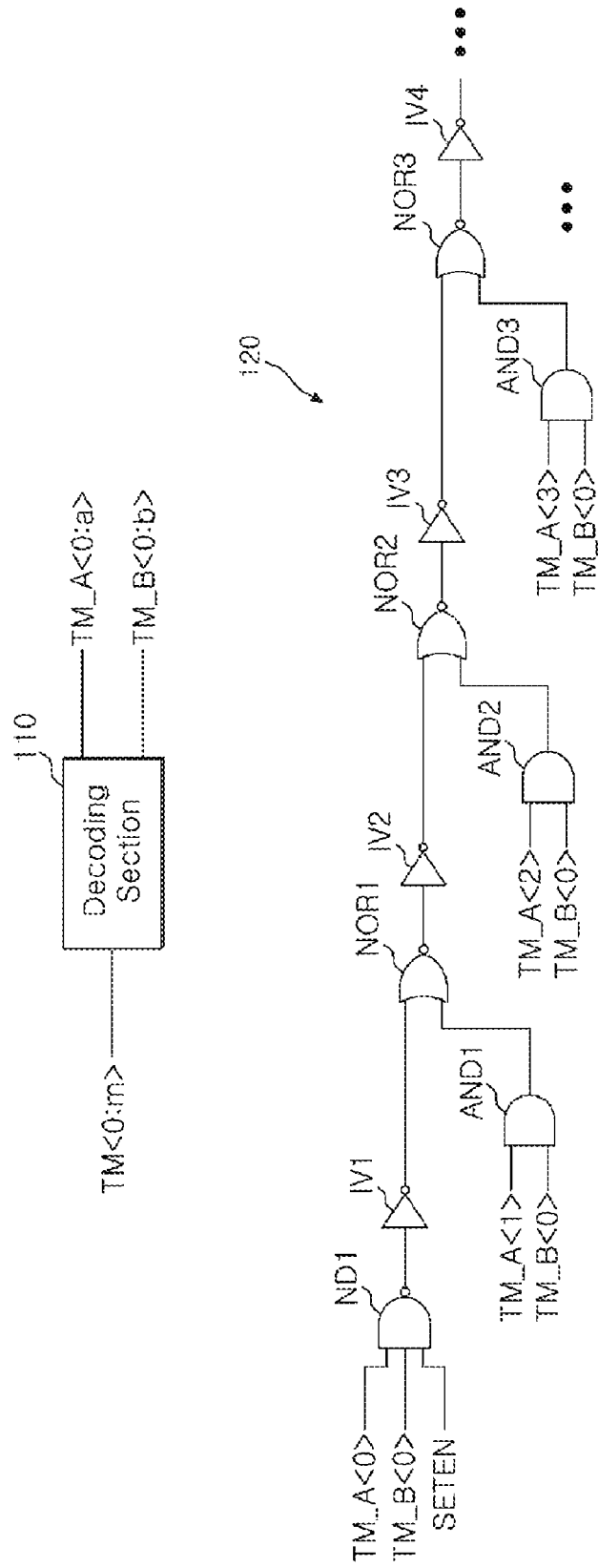
FIG. 6 is a diagram illustrating the configuration of the first transmission control unit shown in FIG. 5.

FIG. 6 is a diagram illustrating the configuration of the first transmission control unit 100 shown in FIG. 5. The first transmission control unit 100 includes a decoding section 110 and a control signal generation section 120. The decoding section 110 may be configured to decode the repair information signals TM<0:m> and generate first and second decoding signals TM_A<0:a> and TM_B<0:b>. The decoding section 110 may be configured in a variety of ways using conventional decoding circuits. For example, in the event that a defect does not occur in the TSVs TSV0 through TSVn-1, the decoding section 110 can output first bits TM_A<0> and TM_B<0> of the first and second decoding signals TM_A<0:a> and TM_B<0:b> as a high level, and, in the event that a defect occurs in any one of the TSVs TSV0 through TSVn−1, the decoding section 110 can output a bit of the first decoding signals TM_A<0:a> that corresponds to the TSV having the defect as a high level.

The control signal generation section 120 may be configured to receive the first and second decoding signals TM_A<0:a> and TM_B<0:b> and generate the first through $n^{th}$ control signals sel<0:n−1>. Referring to FIG. 6, the control signal generation section 120 includes a NAND gate ND1, first through third AND gates AND1 through AND3, first through third NOR gates NOR1 through NOR3, and first through fourth inverters IV1 through IV4. The NAND gate ND1 receives a first bit TM_A<0> of the first decoding signals TM_A<0:a> and a first bit TM_B<0> of the second decoding signals TM_B<0:b>, and an enable signal SETEN. The enable signal SETEN can be generated in the decoding section 110, or a signal generated in the semiconductor apparatus may be used as the enable signal SETEN. In the event that a defect does not occur in the first through $n^{th}$ TSVs TSV0 through TSVn−1, the enable signal SETEN is disabled to a low level, and in the event that a defect occurs in any TSV, the enable signal SETEN is enabled to a high level.

The first inverter IV1 inverts the output of the NAND gate ND1 and generates the first control signal sel<0>. The first AND gate AND1 receives a second bit TM_A<1> of the first decoding signals TM_A<0:a> and the first bit TM_B<0> of the second decoding signals TM_B<0:b>. The first NOR gate NOR1 receives the output of the first inverter IV1 and the output of the first AND gate AND1. The second inverter IV2 inverts the output of the first NOR gate NOR1 and generates the second control signal sel<1>. The second AND gate AND2 receives a third bit TM_A<2> of the first decoding signals TM_A<0:a> and the first bit TM_B<0> of the second decoding signals TM_B<0:b>. The second NOR gate NOR2 receives the output of the second inverter IV2 and the output of the second AND gate AND2. The third inverter IV3 inverts the output of the second NOR gate NOR2 and generates the third control signal sel<2>. The third AND gate AND3 receives a fourth bit TM_A<3> of the first decoding signals TM_A<0:a> and the first bit TM_B<0> of the second decoding signals TM_B<0:b>. The third NOR gate NOR3 receives the output of the third inverter IV3 and the output of the third AND gate AND3. The fourth inverter IV4 inverts the output of the third NOR gate NOR3 and generates the fourth control signal sel<3>. AND gates which receive respective bits of the first decoding signals TM_A<0:a> and the first bit TM_B<0> of the second decoding signals TM_B<0:b>, and NOR gates and inverters connected to output the control signals sel<0:n−1> can be provided by the number of the control signals sel<0:n−1>.

In the event that a defect does not occur in the first through $n^{th}$ TSVs TSV0 through TSVn−1, the first bit TM_A<0> of the first decoding signals TM_A<0:a> and the first bit TM_B<0> of the second decoding signals TM_B<0:b> have a high level. At this time, the enable signal SETEN is disabled. Thus, the first control signal sel<0> has a low level, and all the second through $n^{th}$ control signals sel<1:n−1> have a low level as well.

For example, in the event that the defect occurs in the third TSV TSV2, the repair information signals TM<0:m> which indicates the third TSV TSV2 are inputted, and the third bit TM_A<2> of the first decoding signals TM_A<0:a> may have a high level. At this time, all the other bits of the first decoding signals TM_A<0:a> have a low level. Thus, the second NOR gate NOR2 receives the output of the second AND gate AND2 which has a high level, and the second NOR gate NOR2 and the third inverter IV3 enables the third control signal sel<2>. As a consequence, since the third NOR gate NOR3 receives the third control signal sel<2> which has a high level, the fourth control signal sel<3> has a high level by way of the third NOR gate NOR3 and the fourth inverter IV4. In this way, all the following control signals sel<4:n−1> can have a high level. The control signal generation section 120 enables the control signal associated with the TSV in which the defect occurs, and automatically and simultaneously enables all the control signals associated with the following TSVs, whereby the control signals sel<0:n−1> for controlling the transmission units TX0 through TXn and the receiving units RX0 through RXn−1 can be easily decoded.

Operations of the repair circuit of a semiconductor apparatus in accordance with one embodiment of the present invention are described below with reference to FIGS. 3 through 6. In the event that the defect occurs in the third TSV TSV2 among the first through $n^{th}$ TSVs TSV0 through TSVn−1, the repair information signals TM<0:m> which include information that the defect occurs in the third TSV TSV2 are inputted to the first and second transmission control units 100 and 200. The first and second transmission control units 100 and 200 generate the first and second control signals sel<0:1> which have a low level and the third through $n^{th}$ control signals sel<2:n−1> which have a high level.

Because the first transmission unit TX0 receives the ground voltage VSS and the first control signal sel<0> which has a low level, it outputs the first signal SIG<0> of the ground voltage VSS and the first signal SIG<0>. Consequently, the first signal SIG<0> is transmitted through the first TSV TSV0. Because the second transmission unit TX1 receives the first and second control signals sel<0:1> which have a low level, it outputs the second signal SIG<1> of the first and second signals SIG<0> and SIG<1>. Consequently, the second signal SIG<1> is transmitted through the second TSV TSV1.

The third transmission unit TX2 receives the second control signal sel<1> which has a low level and the third control signal sel<2> which has a high level. Hence, both the second and third signals SIG<1> and SIG<2> are not outputted. Consequently, no signal can be transmitted through the third TSV TSV2 in which the defect occurs.

Since the fourth transmission unit TX3 receives the third and fourth control signals sel<2:3> which have a high level, the third signal SIG<2> of the third and fourth signals SIG<2> and SIG<3> is outputted. Consequently, the third signal SIG<2> is transmitted through the fourth TSV TSV3.

Since the fifth through $n^{th}$ transmission units TX4 through TXn−1 receive the fourth through $n^{th}$ control signals sel<3:n−1> which have a high level, they respectively output the fourth through $n-1^{st}$ signals SIG<3> through SIG<n−2>. Consequently, the fourth through $n-1^{st}$ signals SIG<3> through SIG<n−2> are respectively transmitted through the fifth through $n^{th}$ TSVs TSV4 through TSVn−1. Finally, because the $n+1^{st}$ transmission unit TXn receives an $n^{th}$ bit sel<n−1> of the control signals sel<0:n−1> which has a high level and the external supply voltage VDD, it outputs the $n^{th}$ signal SIG<n−1> of the $n^{th}$ signal SIG<n−1> and the ground voltage VSS. The repair TSV RTSV transmits the $n^{th}$ signal SIG<n−1>.

Since the first receiving unit RX0 and the second receiving unit RX1 respectively receive the first and second control signals sel<0:1> which have a low level, they respectively output the first and second signals SIG<0> and SIG<1> which are transmitted from the first and second TSVs TSV0 and TSV1.

Since the third receiving unit RX2 receives the third control signal sel<2> which has a high level, it outputs the signal transmitted from the fourth TSV TSV3 among the signals transmitted from the third and fourth TSVs TSV2 and TSV3. Consequently, the third receiving unit RX2 outputs the third signal SIG<2> which is transmitted from the fourth TSV TSV3. The following fourth through n$^{th}$ receiving units RX3 through RXn−1 respectively output the fourth through n$^{th}$ signals SIG<3> through SIG<n−1> which are respectively transmitted from the fifth through n$^{th}$ TSVs TSV4 through TSVn−1 and the repair TSV RTSV.

Therefore, in the event that the defect occurs in the third TSV TSV2, it can be appreciated that the third through n$^{th}$ signals SIG<2> through SIG<n−1> originally intended to be transmitted through the third through n$^{th}$ TSVs TSV2 through TSVn−1 are detoured and transmitted through the fourth through n$^{th}$ TSVs TSV3 through TSVn−1 and the repair TSV RTSV, respectively.

As is apparent from the above description, since the repair circuit of a semiconductor apparatus according to the present invention has transmission units and receiving units capable of selectively transmitting and receiving signals in response to control signals, wiring through complicated signal lines is not required, and a chip area can be efficiently utilized. Also, since a method of generating the control signals is simple, the configuration of a decoding circuit can be simplified.

While a certain embodiment has been described above, it will be understood to those skilled in the art that the embodiment described is by way of example only. Accordingly, the repair circuit of a semiconductor apparatus described herein should not be limited based on the described embodiment. Rather, the repair circuit of a semiconductor apparatus described herein should only be limited in light of the claims that follow when taken in conjunction with the above description and accompanying drawings.

What is claimed is:

1. A repair circuit of a semiconductor apparatus comprising:
   a first transmission unit configured to output a first signal to a first through-silicon via (TSV) in response to a ground voltage and a first control signal;
   a second transmission unit configured to output one of the first signal and a second signal to a second TSV in response to the first control signal and a second control signal;
   a third transmission unit configured to output the second signal to a repair TSV in response to the second control signal and an external supply voltage;
   a first receiving unit configured to output one of signals outputted from the first and second TSVs in response to the first control signal; and
   a second receiving unit configured to output one of signals outputted from the second and repair TSVs in response to the second control signal.

2. The repair circuit according to claim 1, wherein the first and second control signals have information regarding a TSV of the first and second TSVs in which a defect occurs.

3. The repair circuit according to claim 1, wherein the first through third transmission units and the first and second receiving units are disposed in different chips.

4. The repair circuit according to claim 1, further comprising:
   a first transmission control unit configured to receive a repair information signal and generate the first and second control signals; and
   a second transmission control unit configured to receive the repair information signal and generate the first and second control signals.

5. The repair circuit according to claim 4, wherein the first transmission control unit comprises:
   a first decoding section configured to receive the repair information signal and generate a decoding signal which indicates one of the first and second TSVs; and
   a first control signal generation section configured to enable all the first and second control signals when the decoding signal indicating the first TSV is inputted, and enable the second control signal when the decoding signal indicating the second TSV is inputted.

6. The repair circuit according to claim 4, wherein the second transmission control unit comprises:
   a second decoding section configured to receive the repair information signal and generate a decoding signal which indicates one of the first and second TSVs; and
   a second control signal generation section configured to enable all the first and second control signals when the decoding signal indicating the first TSV is inputted, and enable the second control signal when the decoding signal indicating the second TSV is inputted.

7. The repair circuit according to claim 4, wherein the repair information signal is inputted to each of the first and second transmission control units through a third TSV.

* * * * *